United States Patent
Jeong

[11] Patent Number: 6,151,270
[45] Date of Patent: Nov. 21, 2000

[54] INTEGRATED CIRCUIT MEMORY DEVICES HAVING PROGRAMMABLE LATENCY PERIODS AND METHODS OF OPERATING SAME

[75] Inventor: Woo-Seop Jeong, Kyunggi-do, Rep. of Korea

[73] Assignee: Samsung Electronics Co., Ltd., Rep. of Korea

[21] Appl. No.: 09/134,586

[22] Filed: Aug. 14, 1998

[30] Foreign Application Priority Data

Nov. 20, 1997 [KR] Rep. of Korea ............... 97-61349

[51] Int. Cl.[7] ............................................. G11C 8/00
[52] U.S. Cl. ................. 365/233; 365/230.06; 365/191; 365/194
[58] Field of Search ....................... 365/233, 230.06, 365/194, 191

[56] References Cited

U.S. PATENT DOCUMENTS

| 5,808,961 | 9/1998 | Sawada | 365/233 |
| 5,814,462 | 9/1998 | Konishi et al. | 365/233 |
| 5,835,956 | 11/1998 | Park et al. | 365/233 |

*Primary Examiner*—Richards Elms
*Assistant Examiner*—VanThu Nguyen
*Attorney, Agent, or Firm*—Myers Bigel Sibley & Sajovec

[57] ABSTRACT

Integrated circuit memory devices include a column select signal generator which generates a column select signal (CSL) having leading and trailing edges and a preferred timing controller. The timing controller, which is electrically coupled to the column select signal generator and is responsive to at least one latency state signal (e.g., CLy), adjusts the timing of at least one of the leading and trailing edges of the column select signal pulse as a function of the value of the at least one latency state signal. Here, the value of the latency state signal can be adjusted to cause a shift in the timing of the column select signal (CSL) and thereby reduce the likelihood of reading errors. In particular, the timing controller is responsive to a first internal clock signal (e.g., PCLK) and generates first and second control signals as CSLE and CSLD. The column select signal generator is responsive to the first and second control signals. The first control signal is preferably delayed and inverted relative to the first internal clock signal by a first delay and the second control signal is preferably delayed relative to the first internal clock signal by a second delay which is less than the first delay. The timing controller also adjusts the timing of at least one of the leading and trailing edges of the column select signal by adjusting the values of the first and second delays as a function of the value of the at least one latency state signal.

16 Claims, 10 Drawing Sheets

INTEGRATED CIRCUIT MEMORY DEVICES HAVING PROGRAMMABLE LATENCY PERIODS AND METHODS OF OPERATING SAME

FIELD OF THE INVENTION

The present invention relates to integrated circuits, and more particularly to synchronous integrated circuit memory devices and methods of operating synchronous integrated circuit memory devices.

BACKGROUND OF THE INVENTION

More performance is being demanded of semiconductor memory devices such as DRAMs and SRAMs, by processors used for high powered PC and workstation systems, as well as by cache and graphics subsystems and high speed communications equipment. A rapidly growing classification of fast memory architecture is the synchronous memory. Making a memory synchronous puts it under the control of a system clock. "Wait states", during which a processor must wait for output data from the memory, can be reduced or eliminated using synchronous control. In systems with synchronous memory, input addresses can be latched into the memory, freeing a processor to perform other tasks until data is available after a predetermined number of cycles. While the intrinsic speed of a memory does not increase with the addition of a synchronous interface, the overall effective speed of the system increases because waiting time is reduced. Another advancement of the synchronous memory is its ability to synchronously burst data at a high-speed data rate.

Many synchronous memories also come with programmable features, such as a programmable column address strobe (CAS) latency period. The term "CAS latency" refers to a time interval which is measured from an active edge point of the CAS signal to a point in time when an output is generated in response to the CAS signal. For example, if a CAS latency of two clock cycles is programmed, then data will be output one clock cycle after a read command has been received. However, if a CAS latency of three clock cycles has been programmed, then data will be output two clock cycles after a read command has been received. Accordingly, the CAS latency determines the clock cycle at which data will become available after a read/write command has been provided. The CAS latency is also typically unaffected by clock rate.

As will be understood by those skilled in the art, depending on the frequency, data can be made available at an output buffer as early as one clock cycle less than the CAS latency. Generally, a CAS latency of one (1) can be programmed for clock rates below 33 MHZ, a CAS latency of two (2) can be programmed for clock rates ranging from 34 to 67 MHZ, and a CAS latency of three (3) can be programmed for clock rates ranging from 68 to 100 MHZ or above.

Referring now to FIG. 1, a conventional synchronous memory device capable of utilizing different CAS latency modes of operation is illustrated in block diagram form. The synchronous memory includes a memory cell array 10, a mode register 11, a column address buffer 12, a column pre-decoder 13, a main column decoder 14, a block sense amplifier (BLSA) and input/output (I/O) gate circuit 15, a write enable buffer 16, internal clock generators 17, 18 and 19, a CSL timing controller 20, an I/O sense amplifier 21, and a data output buffer 22.

Memory cell array 10 consists of an array of memory cells arranged in rows and columns. The mode register 11 stores the data for controlling the various operating modes of the synchronous memory. The mode register 11 may be programmed after power-on and before normal operation. In addition, the mode register 11 may also be changed during operation. The "mode register set cycle" may occur while holding a chip select signal $\overline{CS}$, a row address strobe signal $\overline{RAS}$, a column address strobe signal $\overline{CAS}$, and a write enable signal $\overline{WE}$ low and having present on the address lines the valid mode information to be written into the mode register 11. During operation, the mode register 11 generates a latency state signal CLi (i=1, 2 or 3), which represents a CAS latency of one, two, or three clock cycles, in accordance with the programmed CAS latency period. A column address CA, which is applied to column pre-decoder 13 via column address buffer 12, is decoded.

Using a decoded column address DCA from the pre-decoder 13, the main column decoder 14 generates a column select signal CSL for selecting a column of the memory cell array 10. The column select signal CSL is provided to the block sense amplifier and I/O gate 15, so that data can be sensed, amplified and provided to the data bus DIO. An external clock CLK is also fed to the first internal clock generator 17. The first internal clock generator 17 generates an internal clock signal PCLK which is synchronized to the external clock signal CLK. Write enable buffer 16 generates a write state signal PWR which is also synchronized with the internal clock signal PCLK, in response to an externally applied write enable signal $\overline{WE}$. A second internal clock generator 18 receives the latency state signal CLi from the mode register 11 and the write state signal PWR, and generates an internal clock signal FRP which is synchronized with the internal clock signal PCLK. Internal clock generator 19 generates an internal clock signal CLKDQ in synchronization with the external clock signal CLK. A CSL timing controller 20 is fed with the internal clock signal PCLK and generates two control signals $\overline{CSLE}$ and CSLD to control the timing of the active and inactive edge points of the column select signal CSL. The control signals $\overline{CSLE}$ and CSLD are synchronized with the internal clock signal PCLK. The I/O sense amplifier 21 senses and amplifies the data on the data bus DIO. After a sensing operation, the amplifier 21 latches the sensed data in response to the internal clock signal FRP and provides the latched data to the data bus DO. The data output buffer 22 latches the data on the data bus DO in synchronization with the internal clock signal CLKDQ. The latched data is outputted onto a data output lead DOUT.

FIGS. 2 and 3 show conventional exemplary circuits for the main column decoder 14 and the CSL timing controller 20 in FIG. 1, and FIGS. 4 and 5 are timing diagrams for describing operations of the conventional synchronous memory device. Referring first to FIG. 3, the CSL timing controller 20 consists of a plurality of inverters electrically connected in series. The CSL timing controller 20 generates control signals $\overline{CSLE}$ and CSLD by delaying the internal clock signal PCLK. The signals $\overline{CSLE}$ and CSLD are used to control the active and inactive edge transitions of the column select signal CSL, respectively. It can be seen that the $\overline{CSLE}$ and CSLD signals have their different delay time periods relative to PCLK, but each signal $\overline{CSLE}$ or CSLD has a constant delay time period regardless of the timing of the read/write command and the CAS latency period.

Referring now to FIG. 2, the main column decoder 14 includes a NOR logic gate 1, an inverter 2, P-channel MOSFETs 3 and 4, an N-channel MOSFET 5 and a latch 8 consisting of cross-coupled inverters 6 and 7. MOSFETs 3, 4 and 5 have their current conduction paths coupled in series between a power supply voltage $V_{DD}$ and the ground voltage $V_{SS}$. One input terminal of the NOR logic gate 1 receives the control signal $\overline{\text{CSLE}}$ from the CSL timing controller 20 and the other receives the decoded column address signal DCA from column pre-decoder 13. The NOR logic gate 1 provides its output signal to the gate terminals of MOSFETs 3 and 5. The control signal CSLD signal is fed through inverter 2 to the gate terminal of MOSFET 4. The latch 8 is coupled to the junction of MOSFETs 4 and 5 and outputs the column select signal CSL.

Referring now to FIG. 4, in each clock cycle of the external clock signal CLK, the logic 1 CSLD signal pulse is followed by a logic 0 $\overline{\text{CSLE}}$ signal pulse. For example, upon receipt of a column address signal A0 and a write command (i.e., low level $\overline{\text{WE}}$) during clock cycle CK0, a high level pulse of the internal clock signal PCLK (being synchronized with the rising edge of the clock signal CLK) is produced by the internal clock generator 17. With different delay time periods, a high level pulse of the CSLD signal and a low level pulse of the $\overline{\text{CSLE}}$ signal are then produced in synchronization with the internal clock signal PCLK. Referring again to FIG. 2, when the CSLD and $\overline{\text{CSLE}}$ signals are inactive (i.e., CSLD=0 and $\overline{\text{CSLE}}$=1), MOSFET 3 is turned on and MOSFETs 4 and 5 are turned off because the decoded column address signal DCA (A0) remains active at a low level throughout the cycle. If the CSLD signal then goes active to a high level, MOSFET 4 will turn on and a low logic signal will be latched by latch 8. As a result, the column select signal CSL from the main decoder 14 will remain at a low logic level. Thereafter, if the $\overline{\text{CSLE}}$ signal goes to an active low level after the CSLD signal has become inactivated at a low level, then MOSFET 5 will turn on so that the latch 8 latches the CSL signal at a high logic level. When this occurs, the main column decoder 14 outputs a high level CSL signal 42. In FIG. 4, the high level CSL signals 42, 44 and 46 correspond to the address signals A0, A1 and A2, respectively. As can be seen, in the subsequent read cycles CK1–CK3, the active and inactive edge points of the CSL signal are controlled by the 1→0 and 0→1 transitions of the $\overline{\text{CSLE}}$ and CSLD signals, respectively.

FIG. 5 shows a timing diagram for the case when the CAS latency is 3 clock cycles. Referring to FIG. 5, in clock cycle CK3, first data D1 is output to the data output lead DOUT. Therefore, a processor can fetch the data in clock cycle CK4 of the clock signal CLK. As can be seen in the figure, pulse signals FRP and CLKDQ are used for latching data in clock cycles CK2 and CK3, respectively. For a CAS latency of 2, the pulse signal FRP should be generated, and for a CAS latency of 3 both pulse signals FRP and CLKDQ should be generated. Accordingly, considering the clock rate ranges (about 34 to 100 MHZ) for CAS latencies of 2 and 3, the timing of pulse signal FRP should be appropriately determined. That is, the active and inactive edge points of pulse signal FRP should be determined so that for both CAS latencies of 2 and 3, first data D1 can be reliably latched by the FRP signal in clock cycle CK2.

However, in the event the programmed CAS latency is 3 cycles and the clock rate is very high (e.g. about or over 100 MHZ), invalid data D2 may appear on the bus DIO early (i.e., the arrival of the data D2 is earlier than that of the CAS latency 2 operation by a time $\Delta T1$) while the FRP signal remains active (i.e., during clock cycle CK3). This is because the active and inactive edge points of the column select signal CSL are determined by the signals $\overline{\text{CSLE}}$ and CSLD, regardless of the CAS latency period, and these signals $\overline{\text{CSLE}}$ and CSLD also dictate the timing of the FRP signal. In such a case, the invalid data D2 may be latched by the I/O sense amplifier 21 and outputted via the data output buffer 22 during clock cycle CK3 instead of the valid data D1.

To solve this problem, a faster FRP signal is needed, but it may not be easy to make the FRP signal faster since its timing in cycle CK2 is controlled by the clock signal CLK. Another approach to the above problem is to delay the active edge point of the CSL signal for read operations, when the CAS latency period is 3. According to this approach, however, high speed read operation with a CAS latency period of 2 is not guaranteed because the first data should be outputted in the cycle CK2 just after the cycle CK1 for synchronizing a read command input.

SUMMARY OF THE INVENTION

It is therefore an object of the present invention to provide improved integrated circuit memory devices and methods of operating same.

It is another object of the present invention to provide integrated circuit memory devices having reduced susceptibility to reading errors and methods of operating same.

It is still another object of the present invention to provide integrated circuit memory devices having improved column address strobe (CAS) latency programmability and methods of operating same.

These and other objects, advantages and features of the present invention are provided by integrated circuit memory devices which include a column select signal generator which generates a column select signal (CSL) having leading and trailing edges and a preferred timing controller. This preferred timing controller, which is electrically coupled to the column select signal generator and is responsive to at least one latency state signal (e.g., CLy), adjusts the timing of at least one of the leading and trailing edges of the column select signal as a function of the value of the at least one latency state signal. In particular, the value of the latency state signal can be adjusted to cause a shift in the timing of the column select signal (CSL) and thereby reduce the likelihood of reading errors.

According to a preferred aspect of the present invention, the timing controller is responsive to a first internal clock signal (e.g., PCLK) and generates first and second control signals as $\overline{\text{CSLE}}$ and CSLD. The column select signal generator is responsive to the first and second control signals. The first control signal is preferably delayed and inverted relative to the first internal clock signal by a first delay and the second control signal is preferably delayed relative to the first internal clock signal by a second delay which is less than the first delay. The timing controller also adjusts the timing of at least one of the leading and trailing edges of the column select signal by adjusting the values of the first and second delays as a function of the value of the at least one latency state signal.

A write enable buffer is also provided. The write enable buffer is responsive to a write enable signal ($\overline{\text{WE}}$) and the first internal clock signal (PCLK) and generates a write state signal (PWR). The timing controller is also responsive to the write state signal. According to another preferred aspect of the present invention, the timing controller adjusts the values of the first and second delays as a function of the value of the at least one latency state signal if the write state signal is in a first logic state (e.g., logic 1) but does not adjust the values of the first and second delays as a function of the value of the at least one latency state signal if the write state signal is in a second logic state (e.g., logic 0), opposite the first logic state.

The timing controller may also comprise a first delay circuit which is responsive to the first internal clock signal, a second delay circuit which is responsive to an output (PCLKD) of the first delay circuit, the at least one latency state signal (e.g., CLy) and the write state signal (PWR), and a third delay circuit which is responsive to an output (PCLKDD) of the second delay circuit and generates the first and second control signals. Here, the third delay circuit may comprise a first plurality of serially-connected inverters which generate the first control signal $\overline{\text{CSLE}}$ as an inverted and delayed version of the output (PCLKDD) of the second delay circuit, and a second plurality of serially-connected inverters which generate the second control signal CSLD as a delayed version of the output of the second delay circuit. The first delay circuit may also generate a delayed and true version of the first internal clock signal at its output (PCLKD).

According to another embodiment of the present invention, a preferred method of operating a synchronous integrated circuit memory device include the steps of generating a latency control signal (CLy), generating a first internal clock signal (PCLK) and generating first and second control signals $\overline{\text{CSLE}}$ and CSLD as first and second pulse trains, respectively, which are in-sync with the first internal clock signal, if the latency control signal is in a first logic state (e.g., logic 0). Steps are also performed to switch the latency control signal from the first logic state to a second logic state (e.g., logic 1) and then delay the first and second pulse trains in time relative to the first internal clock signal, in response to the step of switching the latency control signal. A step is then performed to generate a column select signal as a third pulse train which has leading edges in-sync with the inactive-to-active transitions associated with the first pulse train and trailing edges in-sync with the inactive-to-active transitions associated with the second pulse train.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout and signal lines and signals thereon may referred to by the same reference symbols.

Figure 1:
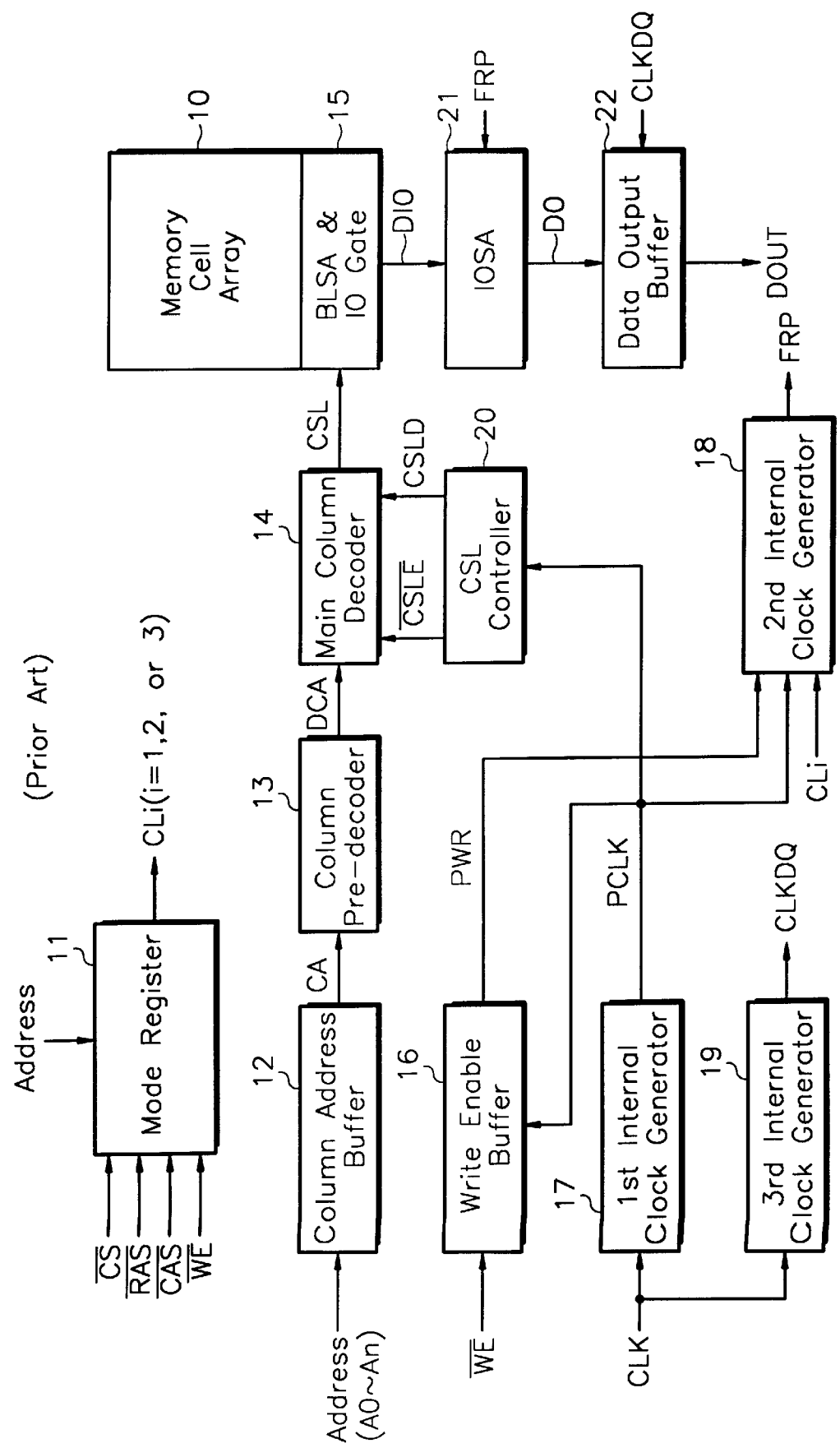
FIG. 1 is block schematic of a conventional integrated circuit memory device.
Figure 2:
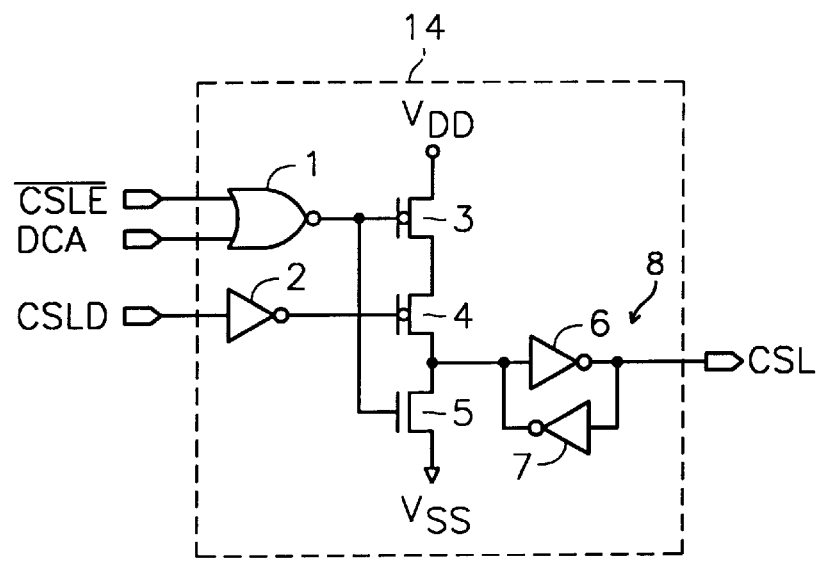
FIG. 2 is an electrical schematic of the main column decoder of FIG. 1.
Figure 3:
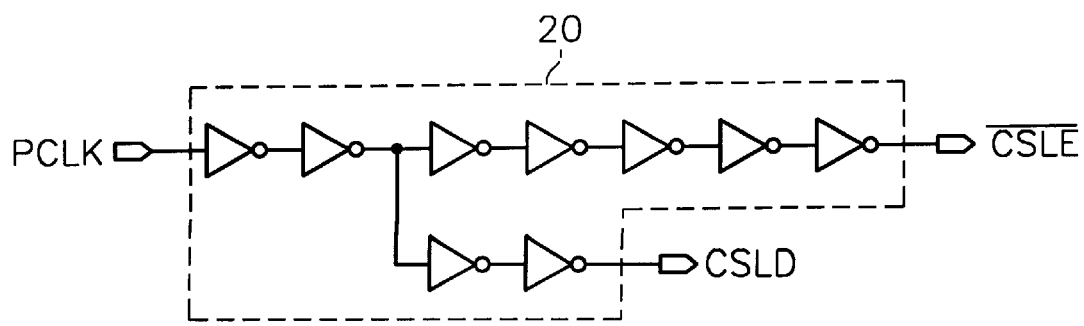
FIG. 3 is an electrical schematic of the CSL timing controller of FIG. 1.
Figure 4:
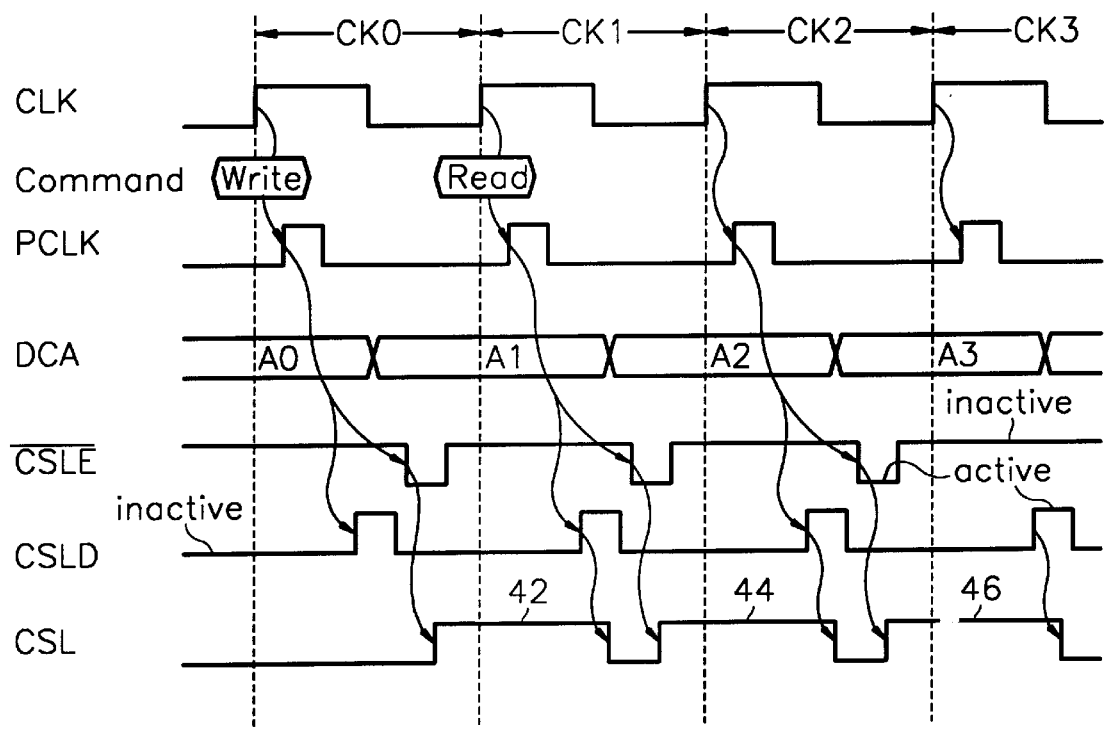
FIG. 4 is a timing diagram which illustrates operation of the CSL timing controller of FIG. 3 and the main column decoder of FIG. 2.
Figure 5:
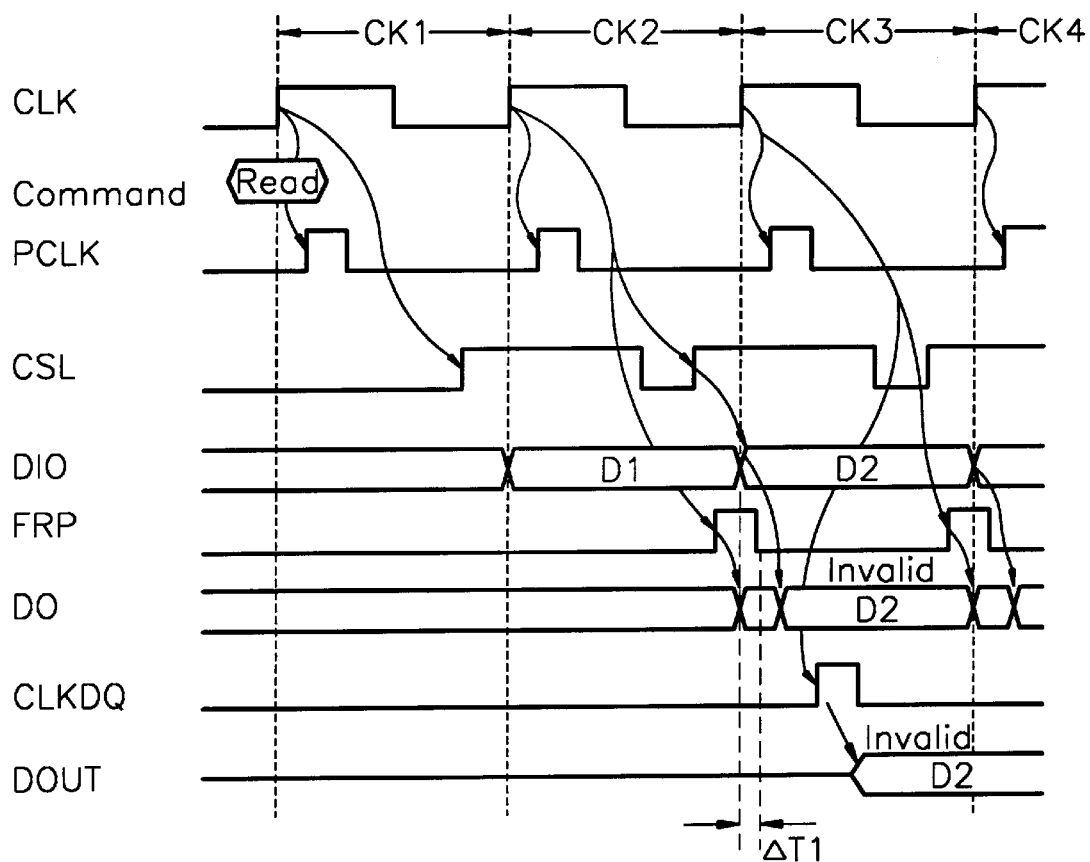
FIG. 5 is a timing diagram which illustrates operation of the integrated circuit memory device of FIG. 1.
Figure 6:
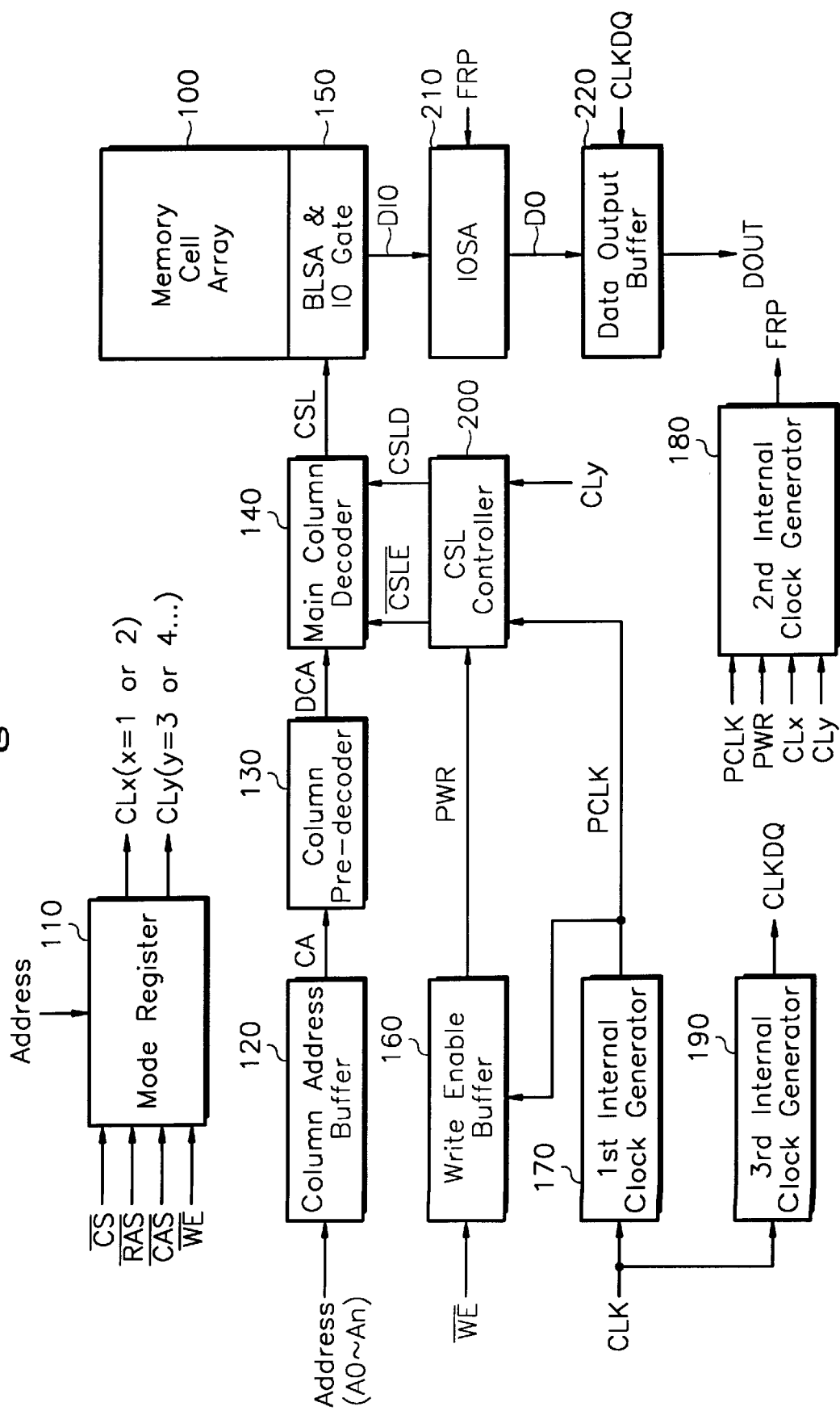
FIG. 6 is block schematic of a synchronous integrated circuit memory device according to a preferred embodiment of the present invention.

Referring now to FIG. 6, a preferred embodiment of a synchronous memory device according to the present invention. The synchronous memory includes a memory cell array 100, a mode register 110, a column address buffer 120, a column pre-decoder 130, a main column decoder 140, a block sense amplifier (BLSA) and input/output (I/O) gate circuit 150, a write enable buffer 160, internal clock generators 170, 180 and 190, a CSL timing controller 200, an I/O sense amplifier 210, and a data output buffer 220.

Memory cell array 100 may comprise a plurality of dynamic random access memory (DRAM), static random access memory (SRAM), or readable and writeable non-volatile memory cells arranged in rows and columns. Mode register 110 stores the data for controlling the various operating modes of the synchronous memory. It programs the CAS latency, addressing mode, burst length, test mode, and various vendor-specific options to make the synchronous memory useful for a variety of different applications. The mode register 110 is programmed after power-on and before normal operation. In addition, the mode register 110 can be changed during operation. The "mode register set cycle" is initiated by a rising edge of a clock when a chip select signal $\overline{\text{CS}}$, a row address strobe signal $\overline{\text{RAS}}$, a column address strobe signal $\overline{\text{CAS}}$, and a write enable signal $\overline{\text{WE}}$ are all held low and the valid mode information to be written into the register 110 is present on the address lines. During operation, the mode register 110 generates two latency state signals CLx and CLy. The latency state signal CLx becomes active only when a CAS latency is less than a predetermined number of external clock cycles (e.g., preferably 3 clock cycles) while the latency state signal CLy becomes active only when a CAS latency is equal to or greater than the predetermined number of clock cycles during a read operation.

A column address CA is applied to the column pre-decoder 130 via the column address buffer 120 and is decoded. Using a decoded column address DCA from the pre-decoder 130, the main column decoder 140 generates a column select signal CSL for selecting a column of the memory cell array 100. The column select signal CSL is provided to block sense amplifier and I/O gate 150 so that data can be sensed, amplified and output to the data bus DIO. An external clock signal CLK is fed to the first internal clock generator 170. The first internal clock generator 170 generates an internal clock signal PCLK which is synchronized to the external clock signal CLK. The write enable buffer 160 generates a write state signal PWR synchronized with the internal clock signal PCLK, in response to an externally applied write enable signal $\overline{\text{WE}}$. A second internal clock generator 180 receives the latency state signals CLx and CLy from the mode register 110 and the write state signal PWR, and generates an internal clock signal FRP synchronized with the clock signal PCLK. A third internal clock generator 190 generates an internal clock signal CLKDQ in synchronization with the external clock signal CLK.

CSL timing controller 200 is fed with the latency state signal CLy (or both CLx and CLy if there is a need to control the active and inactive edge points of the CSL signal for all CAS latencies including 1 and 2) from the mode register 110, the write state signal PWR from the write enable buffer 160 and the clock signal PCLK from the first internal clock generator 170. The controller 200 generates two control signals $\overline{\text{CSLE}}$ and CSLD to control active and inactive edge points of the column select signal CSL. The control signals $\overline{\text{CSLE}}$ and CSLD are synchronized with the internal clock signal PCLK. The control signals $\overline{\text{CSLE}}$ and CSLD are preferably delayed by a first predetermined time period when the latency state signal CLy is activated and a short second predetermined time period when the latency state signal CLx is activated, as described more fully hereinbelow.

Under the control of these control signals $\overline{\text{CSLE}}$ and CSLD, the main column decoder 140 generates a column select signal CSL (whose active and inactive edge points are varied in accordance with the CAS latency periods) by decoding a column address signal DCA from the column pre-decoder 130. The I/O sense amplifier 210 senses and amplifies the data on the data bus DIO. After the sensing operation has been performed, the amplifier 210 latches the sensed data in response to the internal clock signal FRP. The latched data is then provided to a data bus DO. The data output buffer 220 then latches the data on the data bus DO in synchronization with the internal clock signal CLKDQ. The latched data is then transferred to a data output lead DOUT.

Figure 7:
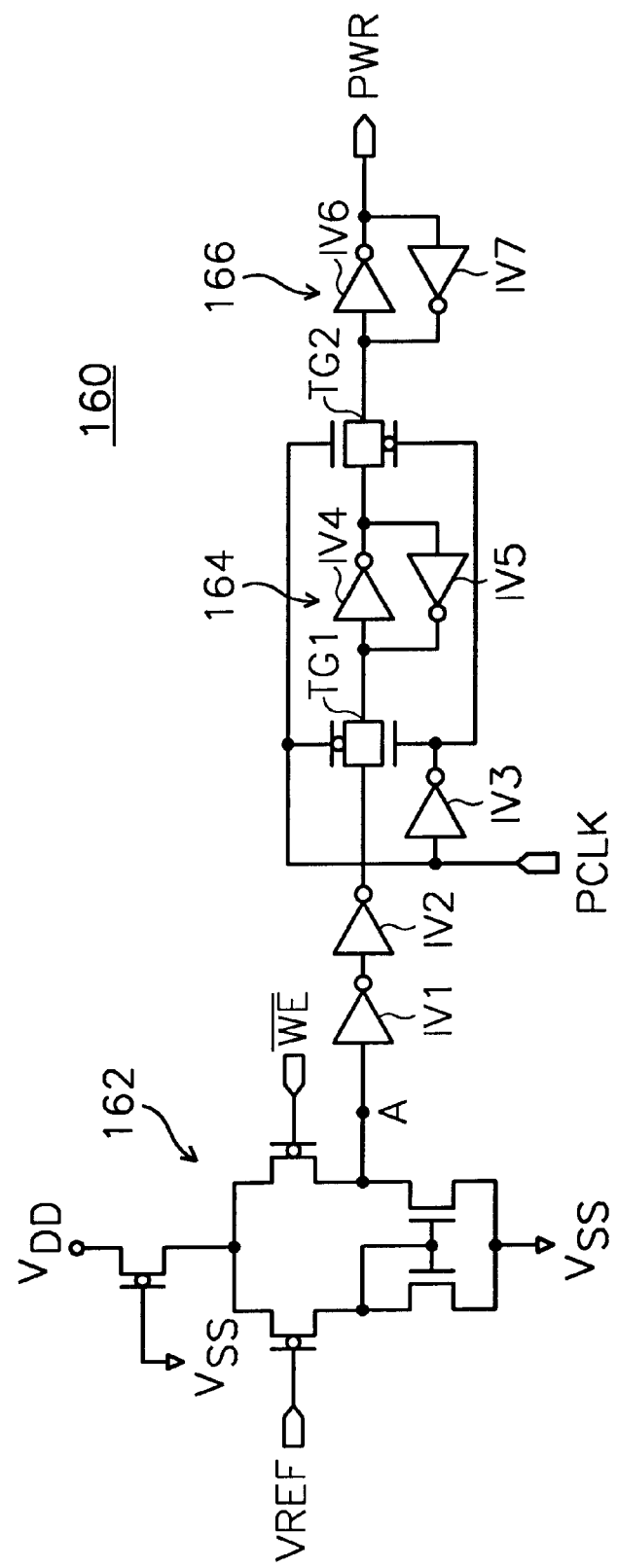
FIG. 7 is an electrical schematic of the write enable buffer of FIG. 6.

FIG. 7 shows an embodiment of the write enable buffer 160. Referring to FIG. 7, the buffer 160 includes a comparator 162 consisting of a differential amplifier, inverters IV1, IV2 and IV3, transmission gates TG1 and TG2 acting as switches, and latches 164 and 166 which each consist of cross-coupled inverters IV4 and IV5, or IV6 and IV7, as illustrated. When the voltage level of the write enable signal $\overline{\text{WE}}$ is lower than that of a reference signal VREF (i.e., during a write operation), node A is held high. On the contrary, when the voltage level of the write enable signal $\overline{\text{WE}}$ is higher than that of the reference signal VREF (i.e., during a read operation), node A is held low. Then, in the event the clock signal PCLK from the first internal clock generator 170 becomes low, transmission gate TG1 will be turned on but transmission gate TG2 will be turned off, so the voltage level of node A is transferred to latch 164 (with inverters IV1 and IV2 acting as a delay circuit). Then, when the clock pulse signal PCLK next goes high, the gate TG1 will be turned off but the gate TG2 will be turned on so the output signal of the latch 164 will be transferred to latch 166. The output signal of the latch 166 (i.e., the write state signal PWR) is then provided to the second internal clock generator 180 and the CSL timing controller 200. Like the internal clock signal FRP, the write state signal PWR is generated in synchronization with the PCLK signal from first internal clock generator 170.

Figure 8:
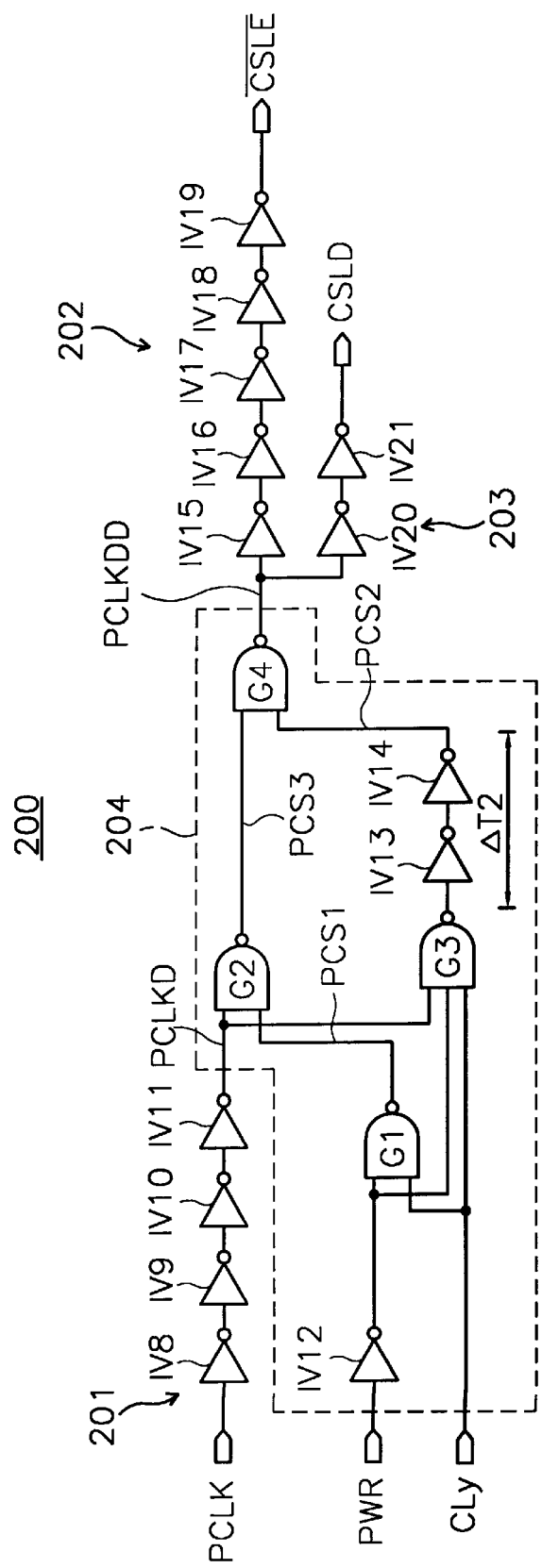
FIG. 8 is an electrical schematic of the CSL timing controller of FIG. 6.

Referring to FIG. 8, an embodiment of the CSL timing controller 200 is shown. The controller 200 generates control signals $\overline{\text{CSLE}}$ and CSLD in-sync with the internal clock signal PCLK and in response to the latency state signal CLy and the write state signal PWR. As described more fully below, the control signals $\overline{\text{CSLE}}$ and CSLD are delayed by an additional predetermined time period ΔT2 when the latency state signal CLy is active (i.e., logic 1) than when the latency state signal CLx is activated (i.e., CLy is inactive).

The CSL timing controller 200 includes delay circuits 201 through 204. The delay circuit 201, consisting of inverters IV8 through IV11, delays the internal clock signal PCLK by a first predetermined delay. The variable delay logic circuit 204 includes NAND logic gates G1 through G4 and inverters IV12 through IV14. The delay logic circuit 204 provides an additional delay to signal PCLKD. In particular, the delay logic circuit 204 provides either a second predetermined delay time on signal path PCS3 or a longer third predetermined delay time on signal path PCS2 to an output PCLKDD, in response to the state signals CLy and PWR. As illustrated, the third delay time is longer than the second delay time by an amount equal to ΔT2. More specifically, during a read operation when the write state signal PWR remains at a high level, if the latency state signal CLy is low, then the voltage levels on signal paths PCS1 and PCS2 become high and the output PCLKD of the delay circuit 201 is transferred via the NAND logic gates G2 and G4 to the delay circuit 202. However, if the latency state signal CLy signal is high, then the voltage level on the path PCS1 is low and that of the path PCS3 is high. Accordingly, the output PCLKD of the delay circuit 201 is transferred to the delay circuit 202 via the NAND logic gate G3, inverters IV13 and IV14, and the NAND gate logic G4 in this order.

The delay circuit 202, which consists of inverters IV15 through IV19, generates the first control signal $\overline{\text{CSLE}}$ by adding a fourth predetermined delay time to an output signal PCLKDD of the delay circuit 204. The delay circuit 203, consisting of inverters IV20 and IV21 generates the second control signal CSLD by adding a fifth predetermined delay time to the output signal PCLKDD of the delay circuit 204. According to another aspect of the present invention, if there is a need to control the active and inactive edge points of the CSL signal for all CAS latencies (including 1 and 2) then the CSL timing controller 200 would be controlled by both CLx and CLy.

Figure 9:
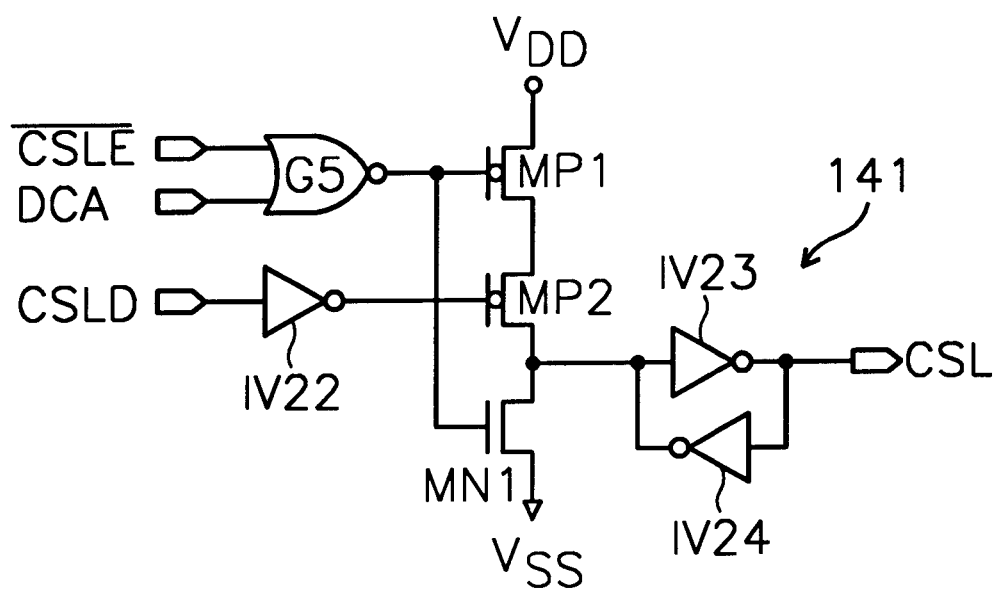
FIG. 9 is an electrical schematic of the main column decoder of FIG. 6.

FIG. 9 is a detailed circuit diagram of the main column decoder 140. Referring to FIG. 9, the main column decoder 140 includes a NOR logic gate G5, an inverter IV22, P-channel MOSFETs MP1 and MP2, an N-channel MOSFET MN1, and a latch 141 consisting of cross-coupled inverters IV23 and IV24. MOSFETs MP1, MP2 and MN1 have their current conduction paths coupled in series between a power supply voltage $V_{DD}$ and the ground voltage $V_{SS}$. One input terminal of the NOR logic gate G5 receives the control signal $\overline{\text{CSLE}}$ from the CSL timing controller 200 and the other input terminal receives the column address DCA from the column pre-decoder 130. The NOR logic gate G5 provides its output signal to the gate terminals of MOSFETs MP1 and MN1. The CSLD signal is fed through inverter IV22 to the gate terminal of MOSFET MP2. Latch 141 is coupled to the junction of MOSFETs MP2 and MN1 and outputs the column select signal CSL.

Figure 10:
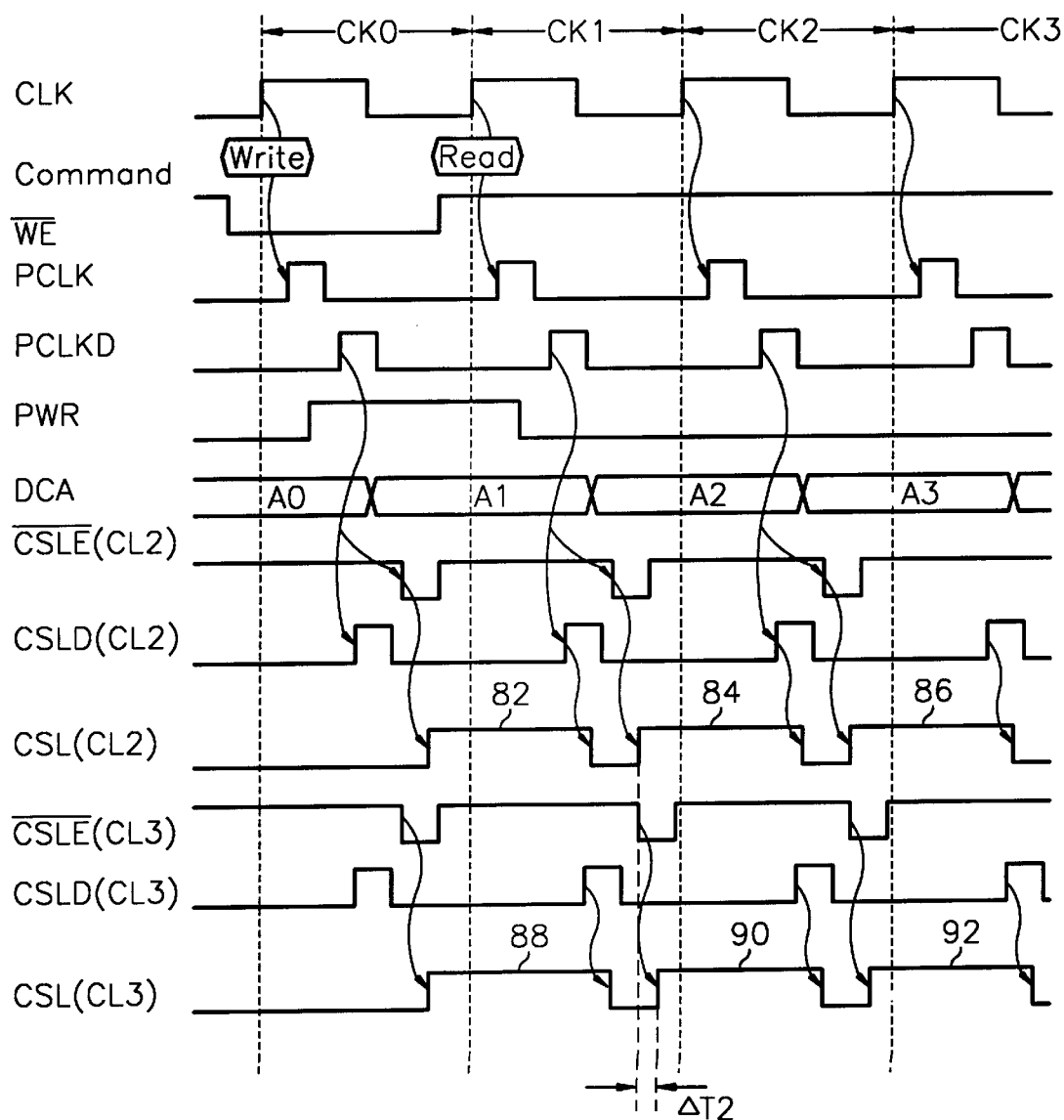
FIG. 10 is a timing diagram which illustrates operation of the CSL timing controller of FIG. 8 and the main column decoder of FIG. 9.
Figure 11:
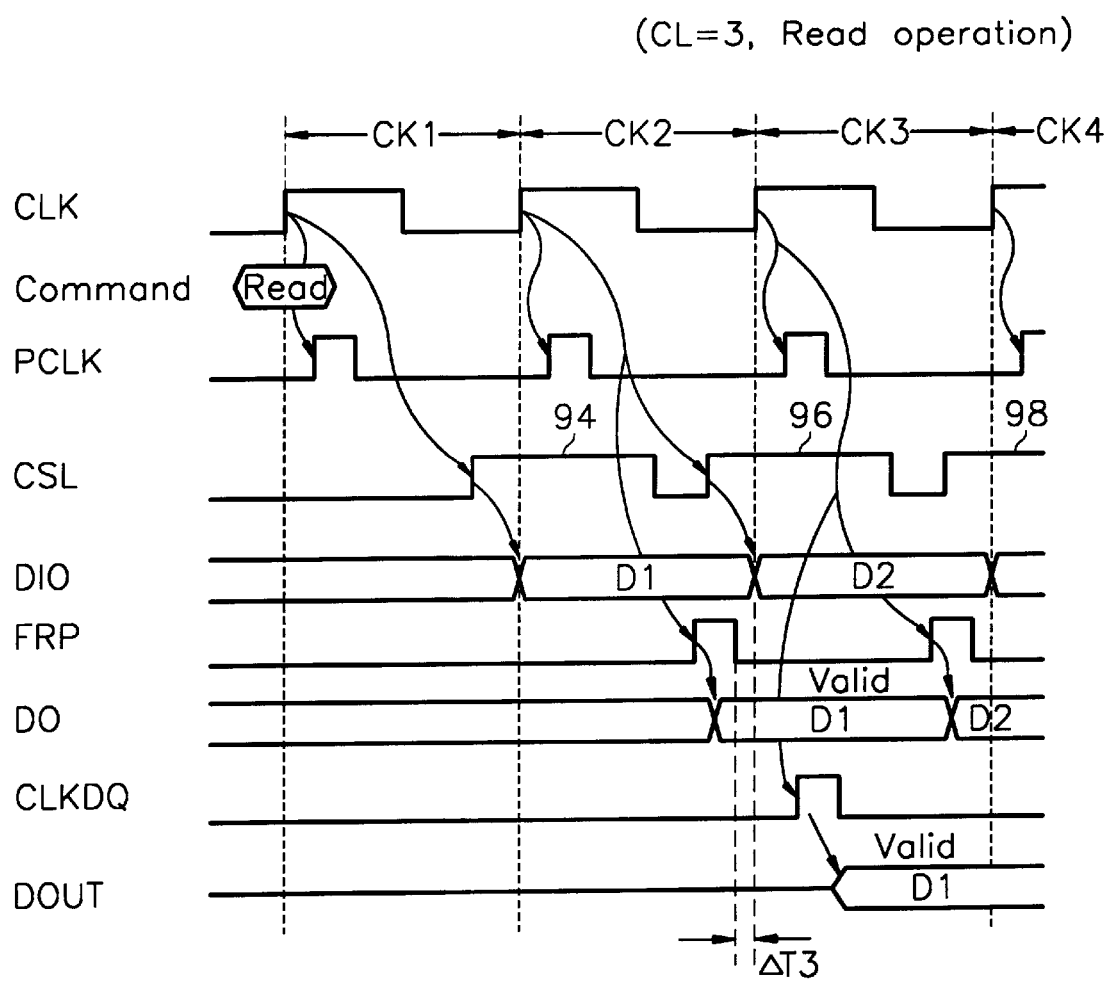
FIG. 11 is a timing diagram which illustrates operation of the integrated circuit memory device of FIG. 6.

Referring now to FIGS. 10 and 11, timing diagrams for describing operations of the synchronous memory device according to an embodiment of the present invention are provided. As illustrated by FIG. 10, during each clock cycle of the external clock signal CLK, each logic 1 pulse of the CSLD signal is followed by a logic 0 pulse of the $\overline{\text{CSLE}}$ signal. For example, in clock cycle CK0 of the external clock signal CLK and with the input of a column address signal A0 and a write command (i.e., low level $\overline{\text{WE}}$), a high level clock pulse of the signal PCLK (being synchronized with the rising edge of the clock signal CLK) is produced by the first internal clock generator 170. With different delay time periods, a high level pulse of the CSLD signal and a low level pulse of the $\overline{\text{CSLE}}$ signal are then produced in synchronization with each respective pulse of the PCLK signal. While the CSLD and $\overline{\text{CSLE}}$ signals are both inactive, MOSFET MP1 is turned on and MOSFETs MP2 and MN1 are turned off because the DCA signal (A0) remains active at a low logic level throughout the cycle. With MOSFET MP1 being on, if the CSLD signal goes active high then MOSFET MP2 will be turned on and a low logic signal will be latched by latch 141. As a result, the CSL signal from the main decoder 140 will remain at a low logic level.

Thereafter, if the $\overline{\text{CSLE}}$ signal goes to an active low level after the CSLD signal has become inactive, then MOSFET MN1 will be turned on and MOSFET MP1 will be turned off, and the latch 141 will set the CSL signal at a high logic level. When this takes place, the main column decoder 140 outputs a high level pulse as CSL signal 82. Accordingly, with the PWR signal being high and with the latency state signal CLy being low (i.e., when the programmed CAS latency is less than 3 clock cycles), the output PCLKD of the delay circuit 201 is transferred via the NAND logic gates G2 and G4 to the delay circuit 202. On the contrary, if the CLy signal is high (i.e., when the programmed CAS latency is equal to or greater than 3 cycles), then the output PCLKD of the delay circuit 201 is transferred to the delay circuit 202 via the NAND logic gate G3, inverters IV13 and IV14, and the NAND gate logic G4. In this latter case, the control signals $\overline{\text{CSLE}}$ and CSLD are more delayed by the time period ΔT2 when the CAS latency is 3 or more than when the CAS latency is 1 or 2. As a result, the active and inactive edge points of the column select signal CSL are delayed by the time period ΔT2.

In FIG. 10, the high level CSL signals 82, 84 and 86 correspond to the address signals A0, A1 and A2, respectively, when CLy=CL2, and the high level CSL signals 88, 90 and 92 correspond to the address signals A0, A1 and A2, respectively, when CLy=CL3. As illustrated, in the subsequent read cycles CK1–CK3, the active and inactive edge points of the column select signal CSL are controlled by the $\overline{\text{CSLE}}$ and CSLD signals.

FIG. 11 shows a timing diagram for the case when the CAS latency is programmed to be 3 clock cycles. Referring to FIG. 11, although the timing of the FRP signal for latching data in clock cycle CK2 is fixed (to enable high speed read operation when the CAS latency is 2), data D2 is provided onto the data bus DIO after an elapse of time (ΔT3) from the falling edge point of the FRP signal because the active edge point of the column select signal CSL is delayed by the delay time (ΔT2) in clock cycle CK2, as illustrated by FIG. 10. Accordingly, high speed read operation with a CAS latency of 2 is provided and the data read-out failure in a read operation with a CAS latency of 3 (or more) can be prevented by variably controlling the active and inactive edge points of the CSL signal depending on the CAS latency periods.

In addition, although the latency state signal CLy becomes active when a CAS latency is 3 and the variable delay logic circuit illustrated by FIG. 8 consists of NAND logic gates and inverters only, other CAS latencies and circuit configurations may be used to achieve the same or similar results, and if there is a need to control the active and inactive edge points of the CSL signal for all CAS latencies then the CSL timing controller can be controlled by both CLx and CLy.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:
   a column select signal generator which generates a column select signal pulse having leading and trailing edges; and
   a controller, electrically coupled to said column select signal generator and responsive to at least one latency state signal, which adjusts the timing of at least one of the leading and trailing edges of the column select signal pulse as a function of the value of the at least one latency state signal;
   wherein said controller is responsive to a first internal clock signal and generates first and second control signals; wherein said column select signal generator is responsive to the first and second control signals; wherein the first control signal is delayed relative to the first internal clock signal by a first delay; wherein the second control signal is delayed relative to the first internal clock signal by a second delay which is less than the first delay; and wherein said controller adjusts the timing of at least one of the leading and trailing edges of the column select signal pulse by adjusting the values of the first and second delays as a function of the value of the at least one latency state signal.

2. The memory device of claim 1, wherein the first control signal is a delayed and inverted version of the first internal clock signal.

3. The memory device of claim 1, further comprising a write enable buffer which is responsive to a write enable signal and the first internal clock signal and generates a write state signal; and wherein said controller is responsive to the write state signal.

4. The memory device of claim 3, wherein said controller adjusts the values of the first and second delays as a function of the value of the at least one latency state signal if the write state signal is in a first logic state but does not adjust the values of the first and second delays as a function of the value of the at least one latency state signal if the write state signal is in a second logic state, opposite the first logic state.

5. The memory device of claim 2, further comprising a write enable buffer which is responsive to a write enable signal and the first internal clock signal and generates a write state signal; and wherein said controller is responsive to the write state signal.

6. The memory device of claim 5, wherein said controller adjusts the values of the first and second delays as a function of the value of the at least one latency state signal if the write state signal is in a first logic state but does not adjust the values of the first and second delays as a function of the value of the at least one latency state signal if the write state signal is in a second logic state, opposite the first logic state.

7. The memory device of claim 3, wherein said controller comprises:
   a first delay circuit which is responsive to the first internal clock signal;
   a second delay circuit which is responsive to an output of said first delay circuit, the at least one latency state signal and the write state signal; and
   a third delay circuit which is responsive to an output of said second delay circuit and generates the first and second control signals.

8. The memory device of claim 7, wherein said third delay circuit comprises:
   a first plurality of serially-connected inverters which generate the first control signal as an inverted and delayed version of the output of said second delay circuit; and
   a second plurality of serially-connected inverters which generate the second control signal as a delayed version of the output of said second delay circuit.

9. The memory device of claim 8, wherein said first delay circuit generates a delayed and true version of the first internal clock signal at its output; wherein said first plurality of serially-connected inverters generate a delayed and inverted version of the output of the first delay circuit as the first control signal; and wherein said second plurality of serially-connected inverters generate a delayed and true version of the output of the first delay circuit as the second control signal.

10. An integrated circuit memory device, comprising:

a column select signal generator which generates a column select signal pulse having leading and trailing edges;

a memory cell array;

a first sense amplifier electrically coupled to said memory cell array and responsive to the column select signal pulse;

an input/output gate electrically coupled to said first sense amplifier;

a first internal clock generator which generates a first internal clock signal in response to an external clock signal;

a write enable buffer which is responsive to a write enable signal and the first internal clock signal and generates a write state signal;

a second internal clock generator which generates a second internal clock signal in response to the write state signal, the first internal clock signal and at least one latency state signal;

a second sense amplifier electrically coupled to said input/output gate and responsive to the second internal clock signal; and a controller, electrically coupled to said column select signal generator and responsive to the at least one latency state signal, which adjusts the timing of at least one of the leading and trailing edges of the column select signal pulse as a function of the value of the at least one latency state signal;

wherein said controller is responsive to the first internal clock signal and the write state signal and generates first and second control signals; wherein said column select signal generator is responsive to the first and second control signals; wherein the first control signal is delayed relative to the first internal clock signal by a first delay; wherein the second control signal is delayed relative to the first internal clock signal by a second delay which is less than the first delay; and wherein said controller adjusts the timing of at least one of the leading and trailing edges of the column select signal pulse by adjusting the values of the first and second delays as a function of the value of the at least one latency state signal.

11. The memory device of claim 10, wherein the first control signal is a delayed and inverted version of the first internal clock signal.

12. The memory device of claim 10, wherein said controller adjusts the values of the first and second delays as a function of the value of the at least one latency state signal if the write state signal is in a first logic state but does not adjust the values of the first and second delays as a function of the value of the at least one latency state signal if the write state signal is in a second logic state, opposite the first logic state.

13. The memory device of claim 12, wherein said controller comprises:

a first delay circuit which is responsive to the first internal clock signal;

a second delay circuit which is responsive to an output of said first delay circuit, the at least one latency state signal and the write state signal; and a third delay circuit which is responsive to an output of said second delay circuit and generates the first and second control signals.

14. The memory device of claim 13, wherein said third delay circuit comprises:

a first plurality of serially-connected inverters which generate the first control signal as an inverted and delayed version of the output of said second delay circuit; and a second plurality of serially-connected inverters which generate the second control signal as a delayed version of the output of said second delay circuit.

15. The memory device of claim 14, wherein said first delay circuit generates a delayed and true version of the first internal clock signal at its output; wherein said first plurality of serially-connected inverters generate a delayed and inverted version of the output of the first delay circuit as the first control signal; and wherein said second plurality of serially-connected inverters generate a delayed and true version of the output of the first delay circuit as the second control signal.

16. A method of operating an integrated circuit memory device, comprising the steps of:

generating a latency control signal;

generating a first internal clock signal;

generating first and second control signals as first and second pulse trains, respectively, which are in-sync with the first internal clock signal, if the latency control signal is in a first logic state;

switching the latency control signal from the first logic state to a second logic state opposite the first logic state;

delaying the first and second pulse trains in time relative to the first internal clock signal, in response to said step of switching the latency control signal; and generating a column select signal as a third pulse train which has leading edges in-sync with the inactive-to-active transitions associated with the first pulse train and trailing edges in-sync with the inactive-to-active transitions associated with the second pulse train.

* * * * *